(12) United States Patent
Kimura et al.

(10) Patent No.: US 6,646,421 B2
(45) Date of Patent: Nov. 11, 2003

(54) METHOD AND APPARATUS FOR CONTROLLING RESIDUAL BATTERY CAPACITY OF SECONDARY BATTERY

(75) Inventors: Tadao Kimura, Kobe (JP); Masayoshi Toyota, Toyohashi (JP)

(73) Assignees: Matsushita Electric Industrial Co., Ltd., Osaka (JP); Toyota Jidosha Kabushiki Kaisha, Aichi (JP)

( * ) Notice: Subject to any disclaimer, the term of this patent is extended or adjusted under 35 U.S.C. 154(b) by 7 days.

(21) Appl. No.: 10/163,807

(22) Filed: Jun. 5, 2002

(65) Prior Publication Data

US 2002/0196026 A1 Dec. 26, 2002

(30) Foreign Application Priority Data

Jun. 7, 2001 (JP) .................................. 2001-173030

(51) Int. Cl.[7] .............................................. H01M 10/44
(52) U.S. Cl. .................................. 320/132; 324/427
(58) Field of Search ............................... 320/132, 149; 324/426, 427, 431, 432, 433

(56) References Cited

U.S. PATENT DOCUMENTS 5,691,078 A    11/1997  Kozaki et al.
5,955,869 A  *  9/1999  Rathmann
6,025,695 A  *  2/2000  Friel et al.

FOREIGN PATENT DOCUMENTS

JP       9-171065 A      6/1997
JP    2000-166109 A      6/2000

* cited by examiner

*Primary Examiner*—Edward H. Tso
(74) *Attorney, Agent, or Firm*—Merchant & Gould P.C.

(57) ABSTRACT

A method for controlling a residual battery capacity of a secondary battery, by which the precision of the energy management of the system can be improved substantially, is provided. A current flowing through the battery is detected and the detected current is multiplied by a predetermined charge efficiency so that an operation on a residual battery capacity is performed at least by current integration (S201), an output voltage from the battery is detected and an average of the output voltages detected for a predetermined time period is calculated (S202), an average of the residual battery capacities obtained by the operation for a predetermined time period is calculated (S203), a reference voltage corresponding to the calculated average of residual battery capacities is referred to (S204), the reference voltage and the average voltage is compared (S205), and the predetermined charge efficiency is set variably based on a result of the comparison (S206).

21 Claims, 5 Drawing Sheets

| Initial charge efficiency η0 (%) | | SOC(%) | | | |
|---|---|---|---|---|---|
| | | 20 | 40 | 60 | 80 |
| Temperature (°C) | 20 | 99 | 99 | 99 | 98 |
| | 30 | 99 | 99 | 98 | 97 |
| | 40 | 99 | 98 | 95 | 92 |
| | 50 | 98 | 95 | 92 | 88 |

FIG. 4

| Reference voltage value Vst | | SOC(%) | | | |
|---|---|---|---|---|---|
| | | 20 | 40 | 60 | 80 |
| Temperature (°C) | 20 | 12.70 | 13.11 | 13.45 | 13.86 |
| | 30 | 12.68 | 13.10 | 13.46 | 13.88 |
| | 40 | 12.66 | 13.09 | 13.47 | 13.90 |
| | 50 | 12.64 | 13.08 | 13.48 | 13.92 |

FIG. 5

| | Calculated SOC (%) | Actual SOC | | Δ SOC (%) |
|---|---|---|---|---|
| | | A h | % | |
| With correction | 5 7 | 5.4 | 5 4 | 3 |
| Without correction | 5 3 | 3.2 | 3 2 | 2 1 |

METHOD AND APPARATUS FOR CONTROLLING RESIDUAL BATTERY CAPACITY OF SECONDARY BATTERY

BACKGROUND OF THE INVENTION

1. Field of the Invention

The present invention relates to a technology for controlling a residual battery capacity of secondary batteries such as a nickel-metal hydride secondary battery, which are on board an electric vehicle (PEV), a hybrid vehicle (HEV) and the like, so as to perform an energy management of a system with high precision.

2. Related Background Art

Secondary batteries include a lead battery, a nickel-cadmium (Ni—Cd) battery, a nickel-metal hydride (Ni-MH) battery, a lithium-ion battery, and the like. These batteries have a characteristic of being charged by connecting to an external power source from which a predetermined current is supplied, as electrical power is consumed. With this characteristic, these batteries have been used for various equipment.

For example, the batteries are mounted on a vehicle and serve as a battery for starting an engine, which supplies electrical power to a spark plug of the engine at the time of starting the engine. Recently, Ni-MH batteries are used also for a main power source for driving a motor of an electric vehicle and a so-called hybrid vehicle (HEV) provided with an engine and a motor.

As for HEVs, in a case where an output from an engine is larger than a power required for driving the vehicle, then surplus power is used for driving a generator so as to charge a secondary battery. Conversely, in a case where an output from the engine is smaller, then electrical power from the secondary battery is used for driving the motor so as to compensate a shortage of the power. In the latter case, the secondary battery is discharged. When mounting a secondary battery on a hybrid vehicle or the like, it is required to control such charge/discharge operations so as to maintain appropriate operating conditions.

To this end, a residual battery capacity (i.e., State of Charge (SOC)) control is conducted, where a voltage, a current, a temperature, and the like of the battery are detected, the expected residual battery capacity is estimated by an operation using these values, and a control is conducted so as to optimize a fuel consumption efficiency of the vehicle. In addition, in order to better balance a power assist operation of driving the motor during acceleration and an energy recovery operation (regenerative braking) during deceleration, generally, the SOC level is controlled so as to be in a range between 50% and 70%, for example. That is, if the SOC decreases to 50%, for example, then control for excessive charge is given. Conversely, if the SOC increases to 70%, for example, then control for excessive discharge is given, so that the SOC is brought near the middle of the control range.

Especially, in a secondary battery including as an active material a nickel oxide at a positive electrode, whose voltage variation is small with respect to a variation in the SOC, the SOC mainly is calculated by totaling discharge/charge currents in the battery, and the SOC generally is corrected using a voltage at a low SOC region and a high SOC region where a voltage variation becomes large.

However, such a correction using a voltage at the low and high SOC regions is vulnerable to a memory effect and a steep change in SOC recognition values might occur during correction. Therefore, this method is not favorable for the energy management of the system.

SUMMARY OF THE INVENTION

Therefore, with the foregoing in mind, it is an object of the present invention to provide a method and an apparatus for controlling a residual battery capacity of a secondary battery, by which the precision in the energy management of the system can be improved substantially.

To fulfill the above-stated object, a method for controlling a residual battery capacity of a secondary battery according to the present invention includes: detecting a current flowing through the secondary battery to perform an operation on a residual battery capacity by multiplying the detected current by a predetermined charge efficiency; detecting an output voltage from the secondary battery to calculate an average voltage value of output voltages detected for a predetermined period of time; calculating an average value of residual battery capacities obtained by the operation for the predetermined period of time; referring to a reference voltage value of the secondary battery corresponding to the calculated average value of residual battery capacities; comparing the reference voltage value and the average voltage value; and setting the predetermined charge efficiency variably, based on a result of the comparison.

In this method for controlling a residual battery capacity, an average value of no-load voltages of the secondary battery is calculated for the predetermined period of time, and thus a calculated average value may be set as the average voltage value.

In the above method according to the present invention, as the result of the comparison, if the average voltage value is higher than the reference voltage value, then the predetermined charge efficiency is increased, if the average voltage value is lower than the reference voltage value, then the predetermined charge efficiency is decreased, and if the average voltage value is equal to the reference voltage value, then the predetermined charge efficiency is not changed.

In this case, it is preferable that the increase or the decrease in the predetermined charge efficiency is conducted by adding, subtracting, or multiplying a constant or a value corresponding to a difference between the average voltage value and the reference voltage value with respect to the predetermined charge efficiency.

In the above method according to the present invention, it is preferable that a temperature of the secondary battery is detected and the predetermined charge efficiency is determined based on the detected temperature and a currently calculated residual battery capacity.

In addition, it is preferable that a temperature of the secondary battery is detected and the reference voltage value is determined based on the detected temperature and the average value of residual battery capacities.

To fulfill the above-stated object, a first residual battery capacity control apparatus for a secondary battery according to the present invention includes: a current detection unit that detects a current flowing through the secondary battery; a residual battery capacity operation unit that performs an operation on a residual battery capacity by multiplying a current signal from the current detection unit by a predetermined charge efficiency; a voltage detection unit that detects an output voltage from the secondary battery; an average voltage calculation unit that calculates an average voltage value of voltage signals output from the voltage detection unit for a predetermined period of time; an average residual battery capacity calculation unit that calculates an average value of residual battery capacities obtained by the operation by the residual battery capacity operation unit for a predetermined period of time; a reference voltage storage unit that stores a reference voltage value of the secondary battery, corresponding to the average value of residual battery capacities obtained from the average residual battery capacity calculation unit; a comparison unit that compares the average voltage value obtained from the average voltage calculation unit and the reference voltage value obtained from the reference voltage storage unit; and a charge efficiency setting unit that sets the predetermined charge efficiency variably with respect to the residual battery capacity operation unit, based on a result of the comparison by the comparison unit.

To fulfill the above-stated object, a second residual battery capacity control apparatus for a secondary battery according to the present invention includes: a battery pack composed of a combination of a plurality of electric cells, each of which is a secondary battery, and used in a middle charged state, a current detection unit that detects a current flowing through the battery pack; a residual battery capacity operation unit that performs an operation on a residual battery capacity by multiplying a current signal from the current detection unit by a predetermined charge efficiency; a voltage detection unit that detects an output voltage from the battery pack; an average voltage calculation unit that calculates an average voltage value of voltage signals output from the voltage detection unit for a predetermined period of time; an average residual battery capacity calculation unit that calculates an average value of residual battery capacities obtained by the operation by the residual battery capacity operation unit for a predetermined period of time; a reference voltage storage unit that stores a reference voltage value of each secondary battery, corresponding to the average value of residual battery capacities obtained from the average residual battery capacity calculation unit; a comparison unit that compares the average voltage value obtained from the average voltage calculation unit and the reference voltage value obtained from the reference voltage storage unit; and a charge efficiency setting unit that sets the predetermined charge efficiency variably with respect to the residual battery capacity operation unit, based on a result of the comparison by the comparison unit.

In the first and the second residual battery capacity control apparatus, the average voltage calculation unit may calculate an average value of no-load voltage signals.

In addition, in the first and the second residual battery capacity control apparatus, as the result of the comparison by the comparison unit, if the average voltage value is higher than the reference voltage value, then the charge efficiency setting unit increases the predetermined charge efficiency; if the average voltage value is lower than the reference voltage value, then the charge efficiency setting unit decreases the predetermined charge efficiency; and if the average voltage value is equal to the reference voltage value, then the charge efficiency setting unit does not change the predetermined charge efficiency.

In this case, it is preferable that the charge efficiency setting unit increases or decreases the predetermined charge efficiency by adding, subtracting, or multiplying a constant or a value corresponding to a difference between the average voltage value and the reference voltage value with respect to the predetermined charge efficiency.

It is preferable that the first and the second residual battery capacity control apparatus for a secondary battery further includes a temperature detection unit that detects a temperature in the secondary battery, wherein the charge efficiency setting unit includes a charge efficiency storage unit that stores a charge efficiency corresponding to a temperature signal from the temperature detection unit and a current residual battery capacity from the residual battery capacity operation unit.

Further, it is preferable that the first and the second residual battery capacity control apparatus for a secondary battery further includes a temperature detection unit that detects a temperature in the secondary battery, wherein the reference voltage storage unit stores the reference voltage value corresponding to a temperature signal from the temperature detection unit and an average value of residual battery capacities from the average residual battery capacity calculation unit.

According to the above-stated methods and configurations, when an SOC recognized by the calculation (recognized SOC) is judged to be higher than the actual SOC, the charge efficiency is lowered. Thereby, during the subsequent integration process, the recognized SOC would be decreased from what it was, so that the recognized SOC becomes closer to the actual SOC. On the other hand, when a recognized SOC is judged to be lower than the actual SOC, the charge efficiency is increased. Thereby, during the subsequent integration process, the recognized SOC would be increased from what it was, so that the recognized SOC becomes closer to the actual SOC as well. Therefore, by continuing this control process, the recognized SOC can be controlled constantly so as to become closer to the actual SOC, so that the precision of the energy management of the system can be improved substantially.

BRIEF DESCRIPTION OF THE DRAWINGS

FIG. 4 is a table of initial charge efficiencies stored in the charge efficiency storage unit 111 in FIG. 1.

FIG. 5 is a table of reference voltage values stored in the reference voltage storage unit 9 in FIG. 1.

DETAILED DESCRIPTION OF THE INVENTION

The following describes preferred embodiments of the present invention, with reference to the drawings.

Figure 1:
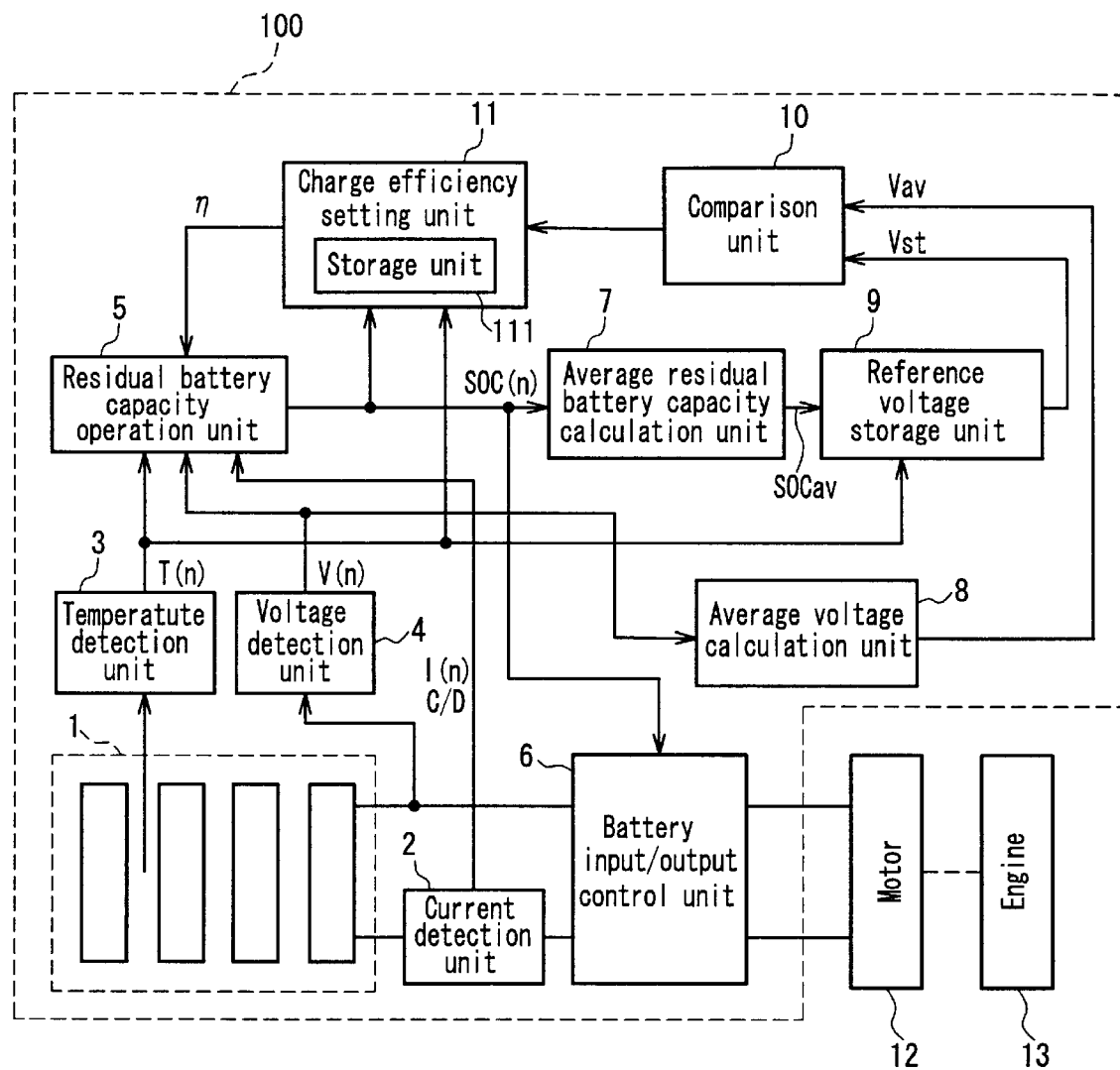
FIG. 1 is a block diagram showing the configuration of a residual battery capacity control apparatus for a secondary battery according to one embodiment of the present invention.

FIG. 1 is a block diagram showing the configuration of a residual battery capacity control apparatus for a secondary battery according to one embodiment of the present invention.

In FIG. 1, reference numeral 1 denotes a battery pack composed of secondary batteries, such as a Ni-MH battery, which is mounted on a hybrid vehicle. In order to attain a predetermined power for a motor 12, this battery pack 1 is composed of a battery pack including a plurality of battery modules (cells) electrically connected in series, each of the battery modules further including a plurality of electric cells that are Ni-MH batteries electrically connected in series. In this embodiment, the battery pack 1 is composed of ten cells that are connected in series and has a capacity of 10 Ah.

Reference numeral 2 denotes a current detection unit that is arranged between a negative output terminal of the battery pack 1 and a negative input terminal of the motor 12. This unit samples a charge/discharge current of the battery pack 1 output from a current sensor (not illustrated) every predetermined period of time so as to obtain a current sample I(n) to detect a magnitude of the current, and at the same time detects a charge/discharge direction C/D that represents a charge state or a discharge state, depending on its sign.

Reference numeral 3 denotes a temperature detection unit. This unit samples a temperature of the battery output from a temperature sensor (not illustrated) arranged at a predetermined position in the battery pack 1 every predetermined period of time so as to obtain a temperature sample T(n).

Reference numeral 4 denotes a voltage detection unit. This unit samples an output voltage from the battery pack 1 every predetermined period of time so as to obtain a voltage sample V(n).

The current sample I(n) and the charge/discharge direction C/D obtained from the current detection unit 2, the temperature sample T(n) obtained from the temperature detection unit 3, and the voltage sample V(n) obtained from the voltage detection unit 4 are supplied to a residual battery capacity (SOC) operation unit 5, where a residual battery capacity SOC(n) in the battery pack 1 is calculated mainly by current integration (current sample I(n).charge efficiency $\eta$). This SOC operation will be described later in detail.

Figure 2A:
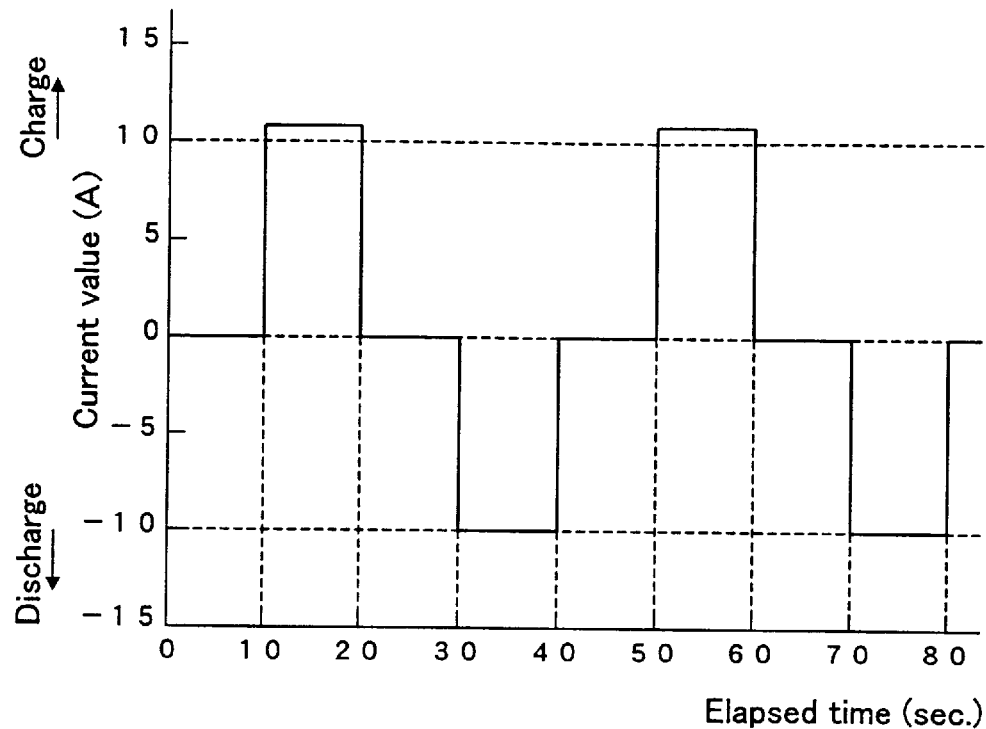
FIG. 2A is a waveform showing a charge excessive pattern by the battery input/output control unit 6 shown in FIG. 1.
Figure 2B:
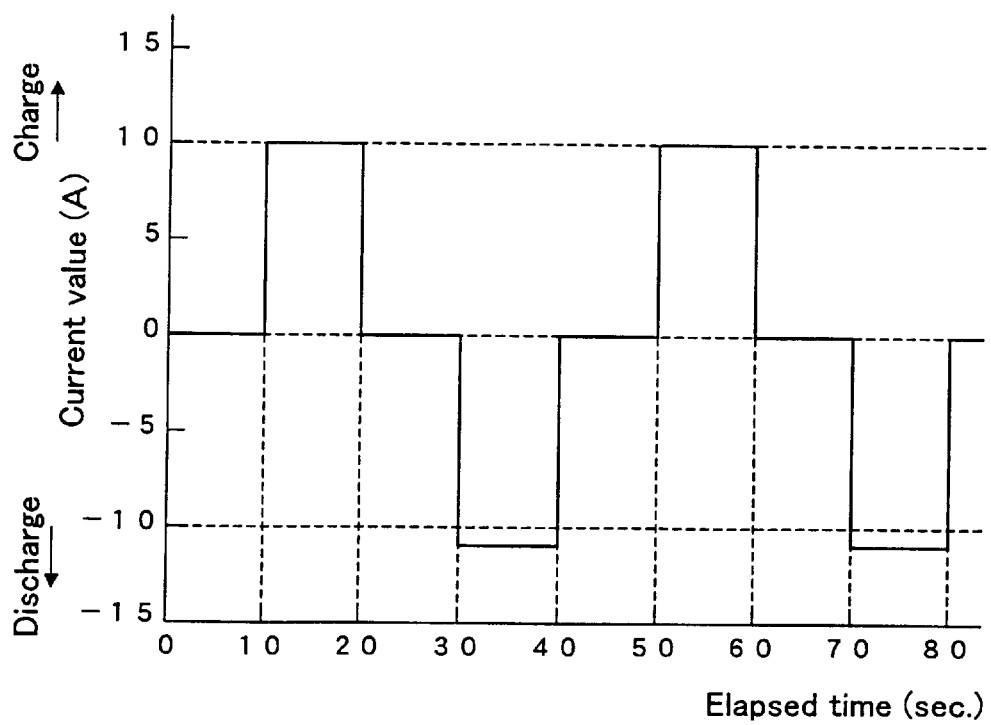
FIG. 2B is a waveform showing a discharge excessive pattern by the battery input/output control unit 6 shown in FIG. 1.

Reference numeral 6 denotes a battery input/output control unit. This unit switches a pattern of charge and discharge with respect to the battery pack 1, based on a current SOC calculated by the residual battery capacity operation unit 5. If an SOC (n) obtained from the residual battery capacity operation unit 5 becomes as low as 50%, which is a lower limit of the control range, then the battery input/output control unit 6 switches into a charge excessive pattern having a charge/discharge current waveform as shown in FIG. 2A. If an SOC(n) obtained from the residual battery capacity operation unit 5 becomes 70%, which is an upper limit of the control range, then the battery input/output control unit 6 switches into a discharge excessive pattern having a charge/discharge current waveform as shown in FIG. 2B.

In addition, the battery input/output control unit 6 controls the amount of charge and discharge with respect to the battery pack 1, in order to perform a power assist operation and a regenerative braking operation of the engine 13 in accordance with a battery input/output request from a driver, such as an acceleration operation and deceleration operation by the driver.

In the above operation, if an input/output request from the driver is a battery output request for accelerating the vehicle and climbing a gradient, then the battery input/output control unit 6 charges the battery pack 1 in a short time after the output request is canceled, whereby the voltage of battery that decreased due to discharge can be increased immediately, which can improve the output performance after that.

Reference numeral 7 denotes an average residual battery capacity calculation unit. This unit calculates an average residual battery capacity SOCav of the SOC(n)s obtained by the operation by the residual battery capacity operation unit 5 for a predetermined time period (e.g. for three minutes).

Reference numeral 8 denotes an average voltage calculation unit. This unit calculates an average voltage value Vav of the voltage sample V(n)s obtained from the voltage detection unit 4 for a predetermined time period (e.g., for three minutes).

Reference numeral 9 denotes a reference voltage storage unit. This unit stores a reference voltage value Vst beforehand, which corresponds to an average residual battery capacity SOCav obtained from the average residual battery capacity calculation unit 7 and a temperature sample T(n) obtained from the temperature detection unit 3. As shown in FIG. 5, for example, the reference voltage storage unit 9 is composed of a memory and is constituted as a look-up table (LUT). Note here that, although FIG. 5 describes only reference voltage values Vst corresponding to specific temperatures and residual battery capacities, reference voltage values Vst corresponding to values between these specific temperatures and between these specific residual battery capacities can be obtained by, for example, interpolation.

Reference numeral 10 denotes a comparison unit. This unit compares an average voltage value Vav obtained from the average voltage calculation unit 8 and a reference voltage value Vst obtained from the reference voltage storage unit 9, and outputs a result of the comparison to a charge efficiency setting unit 11.

The charge efficiency setting unit 11 includes a storage unit 111 that stores an initial charge efficiency $\eta_0$ that corresponds to an SOC(n) calculated by the residual battery capacity operation unit 5 and a temperature sample T(n), as shown in FIG. 4. The charge efficiency setting unit 11 multiplies a difference between the average voltage value Vav and the reference voltage value Vst, which is output from the comparison unit 10 for a predetermined time period, by a predetermined correction coefficient k, then sets the result as an increment or a decrement from the initial charge efficiency $\eta_0$. Then, the charge efficiency setting unit 11 sets a charge efficiency $\eta(=\eta_0+k(Vst-Vav))$ with respect to the residual battery capacity operation unit 5 for the next time period. Based on this charge efficiency $\eta$, the residual battery capacity operation unit 5 calculates a residual battery capacity SOC(n) by current integration of a current sample I(n) and the charge efficiency $\eta$. Note here that, although FIG. 4 describes only initial charge efficiencies $\eta_0$ corresponding to specific temperatures and residual battery capacities, initial charge efficiencies $\eta_0$ corresponding to values between these specific temperatures and between these specific residual battery capacities can be obtained by, for example, interpolation.

Figure 3:
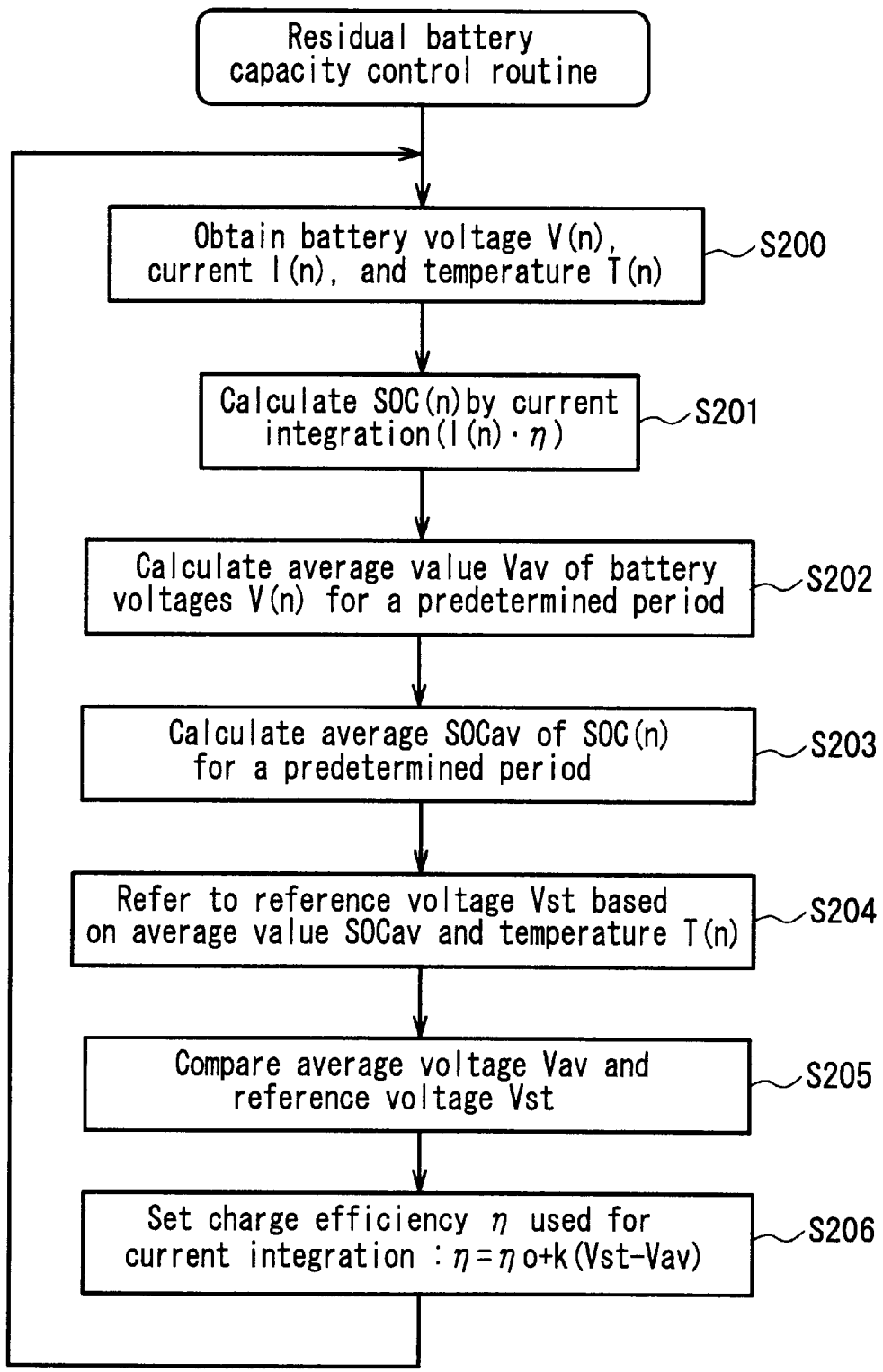
FIG. 3 is a flowchart showing a residual battery capacity control routine according to one embodiment of the present invention.

The following describes a control process in this embodiment having the above-stated configuration, with reference to FIG. 3.

FIG. 3 is a flowchart showing a residual battery capacity control routine according to this embodiment.

First, in FIG. 3, a voltage sample V(n), a current sample I(n), and a temperature sample T(n) are obtained every predetermined sampling time period (S200). Based on these obtained voltage sample V(n), current sample I(n), and temperature sample T(n), a residual battery capacity SOC(n) of the battery pack 1 is calculated mainly by current integration of the current sample I(n) and a charge efficiency $\eta$ (S201). In this step, when calculating the SOC at the initial state, if the current is a charge current based on the charge/discharge direction C/D obtained from the current detection unit 2, then an initial charge efficiency $\eta_0$ in the look-up table shown in FIG. 4 is used as the charge efficiency $\eta$.

Next, an average value Vav of voltage samples V(n) for a predetermined time period, e.g., for three minutes, is calculated (S202). In addition, an average value SOCav of SOC(n)s for the same time period, e.g., for three minutes, also is calculated (S203).

After calculating the average value SOCav of the residual battery capacities in the step S203, based on this average value SOCav of the residual battery capacities and the battery temperature T(n), a reference voltage value Vst is obtained by referring to the look-up table shown in FIG. 5 (S204).

Next, the average voltage value Vav calculated in the step S202 and the reference voltage value Vst obtained in the step S204 are compared with each other (S205), and a charge efficiency $\eta$ for the next three minutes is set as $\eta=\eta_0+k$ (Vst−Vav), based on the difference (S206). After that, the procedure returns to the steps S200 and S201, where a residual battery capacity SOC(n) is calculated by current integration using the set charge efficiency $\eta$, and the following steps are repeated.

Figures 6, 7:
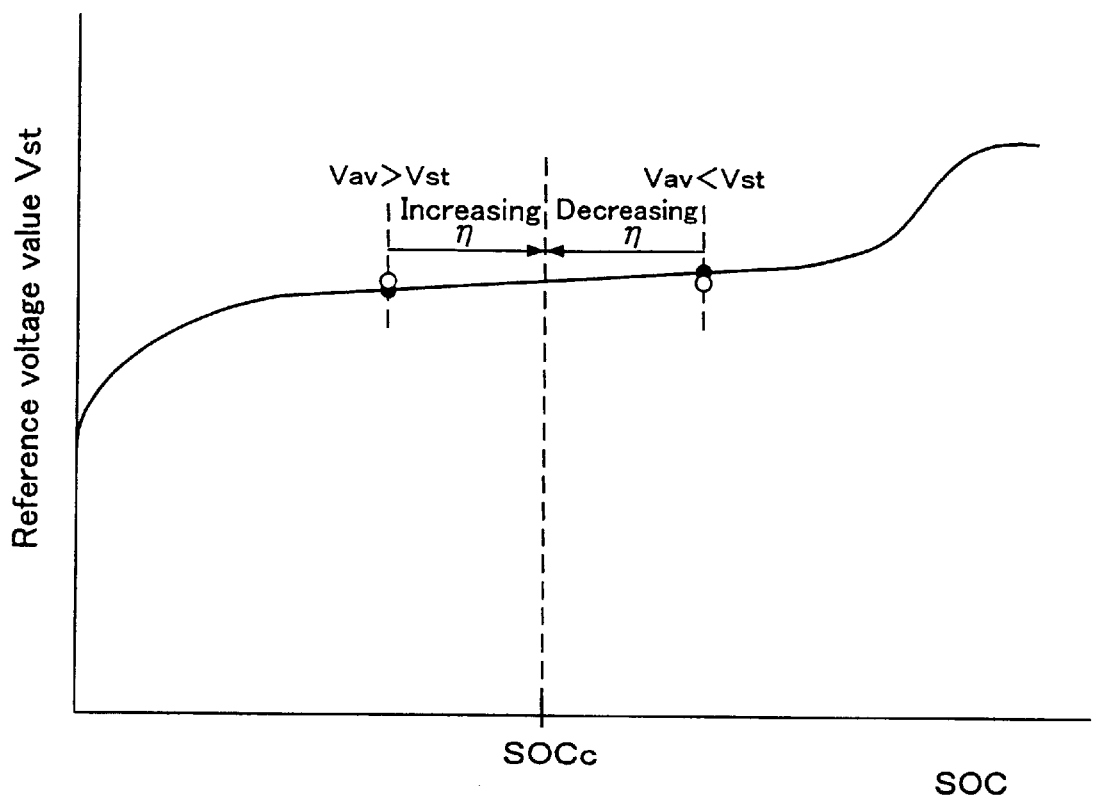
FIG. 6 shows a relationship between the actual SOC and the reference voltage value Vst at a temperature.
FIG. 7 is a table showing an error between a calculated SOC and an actual SOC in a case with a correction of the charge efficiency according to one embodiment of the present invention and in a case without such a correction.

FIG. 6 shows a state where the charge efficiency is increased or decreased according to which is larger of the average voltage value Vav and the reference voltage value Vst so as to control the difference between the average voltage value Vav and the reference voltage value Vst to become zero at the center value (SOCc) of the actual SOC. In FIG. 6, an open circle and a black circle represent an average voltage value Vav and a reference voltage value Vst, respectively.

The following describes the precision of calculated SOCs versus actual residual battery capacities in a case where an SOC is calculated by conducting the above-stated procedure for correcting a charge efficiency based on the difference between the average voltage value Vav and the reference voltage value Vst and in a case without such a procedure for correcting a charge efficiency, with reference to FIG. 7.

FIG. 7 is a table showing an error between a calculated SOC and an actual SOC in a case with a correction of the charge efficiency according to this embodiment and in a case without such a correction. Here, FIG. 7 shows a state after charge and discharge have been continued for 100 hours.

As is evident from FIG. 7, in the case without a correction of the charge efficiency using a voltage value, a large error (21%) occurs between SOCs obtained by integration and actual SOCs due to an error with respect to the true value of the initial charge efficiency $\eta$ and an error of the current sensor. On the other hand, when a charge efficiency $\eta$ used for integration every three minutes is corrected based on the difference between the average value of the battery voltages for three minutes and the reference voltage value Vst determined based on the average value SOCav of the SOCs for the time duration, the calculated SOC and the actual SOC agree well (the error is 3%).

In this way, according to this embodiment, the integration error generated due to the error between the value of the charge efficiency used for integration and the actual charge efficiency of the battery and the error of current sensor can be corrected easily.

Note here that, although the correction method of the charge efficiency in this embodiment is set as $\eta=\eta_0+k$(Vst−Vav), the same effects can be obtained also when a value corresponding to the difference between the average voltage value and the reference voltage value is subtracted or multiplied with respect to a predetermined charge efficiency. Alternatively, the same effects can be obtained when a constant is added, subtracted, or multiplied with respect to the initial charge efficiency, or according to a correction method using another look-up table.

As described above, according to the present invention, an SOC correction is not performed only at a low SOC region and a high SOC region where a variation in a voltage of the battery becomes large as in conventional methods, but a detected voltage and a reference voltage are compared every predetermined time period and the charge efficiency for calculating SOCs are varied based on the result of the comparison, whereby the SOC recognized based on the calculation can be controlled constantly so as to become closer to the actual SOC. As a result, a remarkable effect of improving the precision of the energy management of the system can be obtained.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A method for controlling a residual battery capacity of a secondary battery, comprising:
   detecting a current flowing through the secondary battery to perform an operation on a residual battery capacity by multiplying the detected current by a predetermined charge efficiency;
   detecting an output voltage from the secondary battery to calculate an average voltage value of output voltages detected for a predetermined period of time;
   calculating an average value of residual battery capacities obtained by the operation for the predetermined period of time;
   referring to a reference voltage value of the secondary battery corresponding to the calculated average value of residual battery capacities;
   comparing the reference voltage value and the average voltage value; and
   setting the predetermined charge efficiency variably, based on a result of the comparison.

2. The method for controlling a residual battery capacity of a secondary battery according to claim 1,
   wherein an average value of no-load voltages of the secondary battery is calculated for the predetermined period of time, and the calculated average value is set as the average voltage value.

3. The method for controlling a residual battery capacity of a secondary battery according to claim 1,
   wherein as the result of the comparison, if the average voltage value is higher than the reference voltage value, then the predetermined charge efficiency is increased,
   if the average voltage value is lower than the reference voltage value, then the predetermined charge efficiency is decreased, and
   if the average voltage value is equal to the reference voltage value, then the predetermined charge efficiency is not changed.

4. The method for controlling a residual battery capacity of a secondary battery according to claim 3, wherein the increase or the decrease in the predetermined charge efficiency is conducted by adding, subtracting, or multiplying a constant with respect to the predetermined charge efficiency.

5. The method for controlling a residual battery capacity of a secondary battery according to claim 3,
wherein the increase or the decrease in the predetermined charge efficiency is conducted by adding, subtracting, or multiplying a value corresponding to a difference between the average voltage value and the reference voltage value with respect to the predetermined charge efficiency.

6. The method for controlling a residual battery capacity of a secondary battery according to claim 1,
wherein a temperature of the secondary battery is detected and the predetermined charge efficiency is determined based on the detected temperature and a currently calculated residual battery capacity.

7. The method for controlling a residual battery capacity of a secondary battery according to claim 1,
wherein a temperature of the secondary battery is detected and the reference voltage value is determined based on the detected temperature and the average value of residual battery capacities.

8. A residual battery capacity control apparatus for a secondary battery, comprising:
a current detection unit that detects a current flowing through the secondary battery;
a residual battery capacity operation unit that performs an operation on a residual battery capacity by multiplying a current signal from the current detection unit by a predetermined charge efficiency;
a voltage detection unit that detects an output voltage from the secondary battery;
an average voltage calculation unit that calculates an average voltage value of voltage signals output from the voltage detection unit for a predetermined period of time;
an average residual battery capacity calculation unit that calculates an average value of residual battery capacities obtained by the operation by the residual battery capacity operation unit for a predetermined period of time;
a reference voltage storage unit that stores a reference voltage value of the secondary battery, corresponding to the average value of residual battery capacities obtained from the average residual battery capacity calculation unit;
a comparison unit that compares the average voltage value obtained from the average voltage calculation unit and the reference voltage value obtained from the reference voltage storage unit; and
a charge efficiency setting unit that sets the predetermined charge efficiency variably with respect to the residual battery capacity operation unit, based on a result of the comparison by the comparison unit.

9. The residual battery capacity control apparatus for a secondary battery according to claim 8,
wherein the average voltage calculation unit calculates an average value of no-load voltage signals.

10. The residual battery capacity control apparatus for a secondary battery according to claim 8,
wherein, as the result of the comparison by the comparison unit, if the average voltage value is higher than the reference voltage value, then the charge efficiency setting unit increases the predetermined charge efficiency,
if the average voltage value is lower than the reference voltage value, then the charge efficiency setting unit decreases the predetermined charge efficiency, and
if the average voltage value is equal to the reference voltage value, then the charge efficiency setting unit does not change the predetermined charge efficiency.

11. The residual battery capacity control apparatus for a secondary battery according to claim 10,
wherein the charge efficiency setting unit increases or decreases the predetermined charge efficiency by adding, subtracting, or multiplying a constant with respect to the predetermined charge efficiency.

12. The residual battery capacity control apparatus for a secondary battery according to claim 10,
wherein the charge efficiency setting unit increases or decreases the predetermined charge efficiency by adding, subtracting, or multiplying a value corresponding to a difference between the average voltage value and the reference voltage value with respect to the predetermined charge efficiency.

13. The residual battery capacity control apparatus for a secondary battery according to claim 8, further comprising:
a temperature detection unit that detects a temperature in the secondary battery,
wherein the charge efficiency setting unit comprises a charge efficiency storage unit that stores a charge efficiency corresponding to a temperature signal from the temperature detection unit and a current residual battery capacity from the residual battery capacity operation unit.

14. The residual battery capacity control apparatus for a secondary battery according to claim 8, further comprising:
a temperature detection unit that detects a temperature in the secondary battery,
wherein the reference voltage storage unit stores the reference voltage value corresponding to a temperature signal from the temperature detection unit and an average value of residual battery capacities from the average residual battery capacity calculation unit.

15. A residual battery capacity control apparatus for a secondary battery, comprising:
a battery pack composed of a combination of a plurality of electric cells, each of which is a secondary battery, and used in a middle charged state,
a current detection unit that detects a current flowing through the battery pack;
a residual battery capacity operation unit that performs an operation on a residual battery capacity by multiplying a current signal from the current detection unit by a predetermined charge efficiency;
a voltage detection unit that detects an output voltage from the battery pack;
an average voltage calculation unit that calculates an average voltage value of voltage signals output from the voltage detection unit for a predetermined period of time;
an average residual battery capacity calculation unit that calculates an average value of residual battery capacities obtained by the operation by the residual battery capacity operation unit for a predetermined period of time;
a reference voltage storage unit that stores a reference voltage value of each secondary battery, corresponding to the average value of residual battery capacities obtained from the average residual battery capacity calculation unit;

a comparison unit that compares the average voltage value obtained from the average voltage calculation unit and the reference voltage value obtained from the reference voltage storage unit; and a charge efficiency setting unit that sets the predetermined charge efficiency variably with respect to the residual battery capacity operation unit, based on a result of the comparison by the comparison unit.

16. The residual battery capacity control apparatus for a secondary battery according to claim 15, wherein the average voltage calculation unit calculates an average value of no-load voltage signals.

17. A residual battery capacity control apparatus for a secondary battery according to claim 15, wherein, as the result of the comparison by the comparison unit, if the average voltage value is higher than the reference voltage value, then the charge efficiency setting unit increases the predetermined charge efficiency, if the average voltage value is lower than the reference voltage value, then the charge efficiency setting unit decreases the predetermined charge efficiency, and if the average voltage value is equal to the reference voltage value, then the charge efficiency setting unit does not change the predetermined charge efficiency.

18. A residual battery capacity control apparatus for a secondary battery according to claim 17, wherein the charge efficiency setting unit increases or decreases the predetermined charge efficiency by adding, subtracting, or multiplying a constant with respect to the predetermined charge efficiency.

19. A residual battery capacity control apparatus for a secondary battery according to claim 17, wherein the charge efficiency setting unit increases or decreases the predetermined charge efficiency by adding, subtracting, or multiplying a value corresponding to a difference between the average voltage value and the reference voltage value with respect to the predetermined charge efficiency.

20. A residual battery capacity control apparatus for a secondary battery according to claim 15, further comprising:

a temperature detection unit that detects a temperature in the secondary battery, wherein the charge efficiency setting unit comprises a charge efficiency storage unit that stores a charge efficiency corresponding to a temperature signal from the temperature detection unit and a current residual battery capacity from the residual battery capacity operation unit.

21. A residual battery capacity control apparatus for a secondary battery according to claim 15, further comprising:

a temperature detection unit that detects a temperature in the secondary battery, wherein the reference voltage storage unit stores the reference voltage value corresponding to a temperature signal from the temperature detection unit and an average value of residual battery capacities from the average residual battery capacity calculation unit.

* * * * *